(12) United States Patent
Miyagawa

(10) Patent No.: US 6,949,320 B2
(45) Date of Patent: Sep. 27, 2005

(54) PREPARATION METHOD OF EXPOSURE ORIGINAL PLATE

(75) Inventor: Seiji Miyagawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 88 days.

(21) Appl. No.: 10/419,771

(22) Filed: Apr. 22, 2003

(65) Prior Publication Data

US 2003/0203287 A1 Oct. 30, 2003

(30) Foreign Application Priority Data

Apr. 24, 2002 (JP) ........................................ 2002-121978

(51) Int. Cl.$^7$ .............................. G03F 9/00; G03C 5/00
(52) U.S. Cl. .......................... 430/30; 430/296; 430/942
(58) Field of Search ........................... 430/30, 296, 942

(56) References Cited

FOREIGN PATENT DOCUMENTS

| JP | 9-129531 | 5/1997 |
|---|---|---|
| JP | 2000-323389 | 11/2000 |

*Primary Examiner*—Christopher G. Young
(74) *Attorney, Agent, or Firm*—Foley & Lardner LLP

(57) ABSTRACT

The preparation method of an exposure original plate according to the present invention includes a step of subdividing a pattern constituting an exposure original plate into a plurality of rectangular patterns, a step of extracting micro patterns having the size of a side smaller than a prescribed value from among the divided individual rectangular patterns, a step of forming a corrected micro pattern by increasing the size of the side of the extracted micro pattern perpendicular to the side making contact with an adjacent patter at least by the prescribed value, a step of forming a corrected adjacent pattern by retreating the side of the adjacent pattern making contact with the corrected micro pattern by the increased amount corresponding to the prescribed value, and a step of finding EB exposure data for the pattern including the corrected micro pattern and the corrected adjacent pattern, and carrying out EB exposure by the variable shaped beam exposure method based on the EB exposure data.

19 Claims, 15 Drawing Sheets

PREPARATION METHOD OF EXPOSURE ORIGINAL PLATE

BACKGROUND OF THE INVENTION

1. Field of the Invention

The present invention relates to a preparation method of an exposure original plate such as a photo mask and a reticle, and more particularly to a preparation method of forming a required pattern on the original plate by means of an electron beam (referred to as EB hereinafter) exposure.

2. Description of the Prior Art

The preparation of an exposure original plate such as a photo mask and a reticle by the EB exposure technology is accomplished by irradiating an EB sensitive resist formed on a transparent substrate with EBs in a required pattern using an EB exposure system. In the irradiation of EBs in the required pattern, there exists a technology of scanning the EB sensitive resist with one or a plurality of EBs, or a technology of irradiating the EB sensitive resist with an EB or EBs with its cross section formed in a rectangular form. In either case, it is necessary to prepare exposure data corresponding to a desired pattern to be formed, and carry out EB scanning or exposure using the EB exposure system based on the exposure data.

In the preparation of the EB exposure data, the pattern of the exposure original plate is subdivided into a plurality of rectangular patterns, and data processing is executed by recognizing individual divided rectangular patterns. In the data processing, the so-called optical proximity effect correction (OPC), which corrects the pattern for each part by taking the optical proximity effect into account, is employed, where a technique of a bias method or an inner serif method is available. These are technologies which correct parts of the shape of an object pattern by finding the correlations between the shapes of adjacent patterns, the dimensions between the patterns, and the like. For example, in the bias method, when proximity patterns P2 and P3 exist in parts of a linear wiring pattern P1, as shown in FIG. 14A, a wiring pattern in which part of each side of the wiring pattern P1 is deleted to reduce the pattern width according to the OPC as shown in FIG. 14B, is prepared in order to prevent short-circuiting between these patterns in the pattern formed on the exposure original plate, and EB exposure data corresponding to the corrected pattern are generated. In the meantime, in the inner serif method, when a gate electrode pattern P4 for a MOS transistor is bent in U-shape on both sides of a source-drain region SD, for example, as shown in FIG. 15A, in order to prevent an increase in the gate electrode dimension (gate electrode length) as shown by a broken line in the figure in the connection parts between the bent patterns P42, P43 on both sides and the central rectangular pattern P41, gate electrode pattern in which the inner side of the connection part is deleted to reduce the gate electrode length of the connection part, is created as shown in FIG. 15B, and EB exposure data corresponding to the corrected pattern are prepared.

However, with such a pattern correction by OPC, a problem arises in that micro patterns are generated when the corrected pattern is divided into rectangular patterns. Namely, in the case of the wiring pattern P1 in which portions located close to the proximity patterns are partially removed by the bias method as shown in FIG. 14B, division into a plurality of rectangular patterns P10, P11 and P12 as shown in FIG. 14C generates a rectangular pattern P10 with extremely small width direction size in the portion left by the removal, which becomes a micro pattern. In addition, in the case of the gate electrode pattern P4 by which U-shaped bent part is removed by the inner serif method as shown in FIG. 15B, rectangular patterns P44, P45 and P46 with extremely small size in respective width directions are generated in the regions across the removed portions as shown in FIG. 15C, which become micro patterns.

In recognizing the divided individual rectangular patterns, EB exposure data are prepared by regarding even such a micro pattern, recognized as a micro pattern, as an independent pattern, and EB exposure is carried out based on the obtained EB exposure data. In this case, in the EB exposure method using the point beam raster scan method which EB exposes a required pattern while continuously scanning a mask original plate with an EB of minute beam diameter among EB exposure methods, since the diameter of the EB beam can be reduced to about 0.08 $\mu$m, it is possible to expose properly a minute pattern of 0.1 $\mu$m. However, since a graphic is deleted in the units of about 0.004 $\mu$m in the bias method, rounding in the exposed image occurs at the minimum grid of the diameter of the EB beam. Accordingly, the point beam raster scan method is not applicable to the bias method.

In the meantime, when the exposure method using the variable shaped beam vector scan system (referred to as variable shaped beam exposure method hereinafter) is employed as the EB exposure method, since the current minimum grid is 0.002 $\mu$m, the problem of rounding will not occur, but there may arise a case in which it is not possible to EB expose a micro pattern as a normal pattern. The variable shaped beam exposure method is a technology in which EB beams are formed into a rectangular beam of required size by an aperture, further reducing it to an EB of beam bundle with a minute rectangle by a reduction lens, and expose an exposure original plate with the reduced EB. Because of this, assuming that beam blur due to optical proximity effect in the periphery of the rectangular bundle of EB is generated at a width of, for example, about 0.1 $\mu$m, the effect of the optical proximity effect on the pattern is inevitable when the size of at least one of the sides of the micro pattern is less than 0.1 $\mu$m, and it becomes impossible to normally expose a micro pattern. As a result, pattern defects arise in a pattern of prepared exposure original plate, and if a semiconductor device is manufactured using an exposure original plate with such pattern defects, abnormality in the characteristics of the semiconductor device will occur.

For example, when the pattern is divided into rectangular patterns as in FIG. 14C, the micro pattern P10 fails to be exposed normally as shown in FIG. 14D, with the wiring width of the wiring pattern P1 becoming thin at the intermediate part, the wiring resistance is increased or the wiring is disconnected. In the case of the gate pattern P4 in FIG. 15B, the micro patterns P44, P45 and P46 generated by the division as shown in FIG. 15C fail to be exposed properly, and a gate electrode is formed with the width size, namely the gate electrode length, being especially small in the pattern P41, as shown in FIG. 15D. Accordingly, when micro patterns are generated in the execution of the bias method or the inner serif method, in order to preclude anomalies in the characteristics of the semiconductor device caused by such pattern defects in the exposure original plate, it has been conventional to withdraw the correction portions of the pattern so as to eliminate the micro patterns and to introduce a processing for reinstating the original pattern. As a result, effective use of the bias method or the inner serif method failed, and in that sense elimination of the drawback in the exposure original plate could not be realized.

In Japanese Patent Applications Laid Open, No. 2000-323389 is disclosed a technique, when EB exposure is executed in divided manner, of designing pattern data so as to provide a region where two patterns can be overlapped in a plane, in order to prevent generation of pattern discontinuity in the connection part. However, since this technique is applicable only to a connection part of the patterns and does not apply to micro patterns which do not involve connection with another pattern, such as the micro pattern generated in a part of the pattern by the OPC by the inner serif method as shown in FIG. 15, and is unable to eliminate a drawback due to such a micro pattern.

Moreover, Japanese Patent Applications Laid Open, No. Hei 9-129531 discloses a technique of taking the direction of the pattern division into consideration so as not to generate micro patterns in dividing a pattern into rectangular patterns. Since, however, patterns corrected by the bias method or the inner serif method tend to generate fine irregularities, it is not necessarily possible to prevent the generation of the micro patterns. For example, when the OPC due to the bias method is applied to the edges on the mutually opposite sides, to a linear wiring pattern as shown in FIG. 14, it is inevitable to generate micro patterns in dividing the wiring pattern in either one of longitudinal or lateral direction using the technique described in this disclosure, and it is difficult to eliminate the problem in the above.

BRIEF SUMMARY OF THE INVENTION
Summary of the Invention

The preparation method of an exposure original plate according to the present invention includes a step of dividing a pattern constituting the exposure original plate into a plurality of rectangular patterns, a step of extracting micro patterns having the size of a side smaller than a prescribed value from among the divided individual rectangular patterns, a step of forming a corrected micro pattern for the extracted micro pattern in which the size of at least the side perpendicular to a side in contact with an adjacent pattern is increased by a prescribed amount, a step of forming a corrected adjacent pattern by retreating the side of the adjacent pattern which has been in contact with the side of the corrected micro pattern by the increased portion of the prescribed amount, and a step of finding EB exposure data for the pattern including the corrected micro patterns and the corrected adjacent patterns, and executing EB exposure by the variable shaped beam exposure method based on the EB exposure data.

BRIEF DESCRIPTION OF THE DRAWINGS

The above-mentioned and other features and advantages of this invention will become more apparent by reference to the following detailed description of the invention taken in conjunction with the accompanying drawings, wherein.

DETAILED DESCRIPTION OF THE INVENTION

Figure 1:
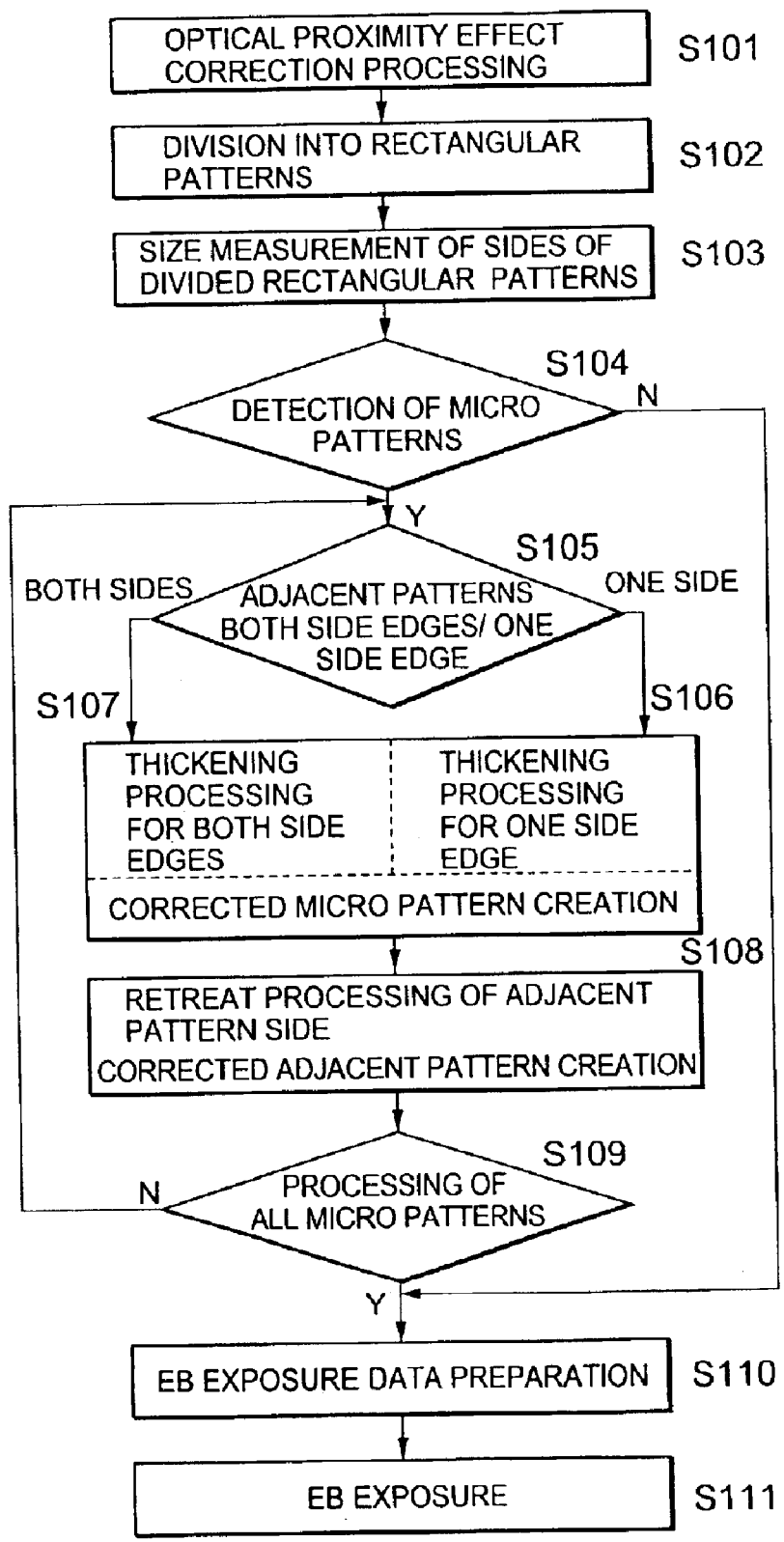
FIG. 1 is a flowchart of a first embodiment of the preparation method according to the present invention.

Referring to the drawings, the embodiments of the present invention will be described. FIG. 1 is a flowchart for a first embodiment. First, an OPC according to the bias method or the inner serif method is applied to mask data (S101). Then, the pattern obtained by the OPC is subdivided into a plurality of rectangular patterns (S102). Next, the size of each side is detected for each divided rectangular pattern (S103), and a rectangular pattern with the smallest size of the side less than a prescribed size (0.1 $\mu$m here) is extracted as a micro pattern (S104). When a micro pattern is not extracted, it proceeds to S110 to be described later. When a micro pattern is extracted, it is determined for the micro pattern whether the long side to which the adjacent pattern is in contact in the short side direction exists on only one side edge (the word an edge being used for a side as deemed appropriate) or on both side edges (S105). Here, what is described by being in contact with one side edge means that the micro pattern is making contact on one edge with an adjacent pattern on one side, and being in contact with both side edges means that the micro pattern is making contact with adjacent patterns on both sides.

Next, the micro pattern is subjected to a thickening processing in the width direction with respect to the long side making contact with the adjacent pattern, to create a corrected micro pattern having a size of the short side not less than 0.1 $\mu$m, preferably larger than 0.2 $\mu$m. In this case, when there is involved one side edge of the micro pattern, thickening is performed only for the long edge on one side of the micro pattern (S106), and when there are involved both side edges, thickening is performed for both of the long edges (S107). Next, the side of the pattern adjacent to the long side of the micro pattern subjected to the thickening is retreated by deleting the portion corresponding to the thickened width (S108). The above processing is applied to all the micro patterns to create corrected patterns subjected to thickening processing for the micro patterns, and to form a corrected adjacent pattern subjected to the side retreat processing for the adjacent pattern (S109). Then, EB exposure data are prepared based on the corrected micro patterns, the corrected adjacent pattern and the other patterns not subjected to correction (S110), and an EB exposure is executed by the variable shaped beam method according to the EB exposure data (S111).

FIG. 2 is a drawing showing a specific example of the pattern of the first embodiment corresponding to the pattern shown in FIG. 14. Assume that there exist a linear wiring pattern P1 with a prescribed width, and proximity patterns P2 and P3 that are in close proximity to the pattern P1, as shown in FIG. 2A. As a result of execution of an OPC according to the bias method, the sides opposite to the proximity patterns P2 and P3 of the wiring pattern P1 are deleted at different positions of the sides, and there is generated a crank-shaped portion X1 in a part in the length direction of the wiring pattern P1 as shown in FIG. 2B. When the pattern obtained by the OPC is divided into rectangular patterns, a rectangular pattern P10 with a micro width is generated at the crank-shaped portion X1 between rectangular patterns P11 and P12 extending on both sides in the length direction. Since a rectangular pattern with the lateral size (the up and down direction and the left and right direction of the drawings will be referred to as longitudinal and lateral directions hereinafter) less than 0.1 $\mu$m is defined as a micro pattern here, the rectangular pattern P10 will be extracted as a micro pattern because the lateral size of the rectangular pattern P10 with micro width will be assumed to be less than 0.1 $\mu$m.

Since the micro pattern P10 makes contact with the adjacent rectangular patterns P11 and P12 at edges on both sides, the micro pattern P10 is subjected to a thickening processing for edges on both sides to expand the edges on both sides of the micro pattern P10 toward the outside by 0.1 $\mu$m each, obtaining a corrected micro pattern 10C with the total lateral size of 0.3 $\mu$m. In addition, corresponding to the thickening processing of the micro pattern P10, the corresponding sides of the adjacent rectangular patterns P11 and P12 on both sides are retreated by deleting portions of width of 0.1 $\mu$m to form corrected adjacent patterns P11C and P12C. Then, EB exposure data for the corrected micro pattern P10C and the corrected adjacent patterns P11C and P12C thus formed are prepared, and by carrying out exposure using a variable shaped beam exposure system based on the EB exposure data, wiring pattern P1C is EB exposed in a pattern as shown in FIG. 2E.

Figure 3:
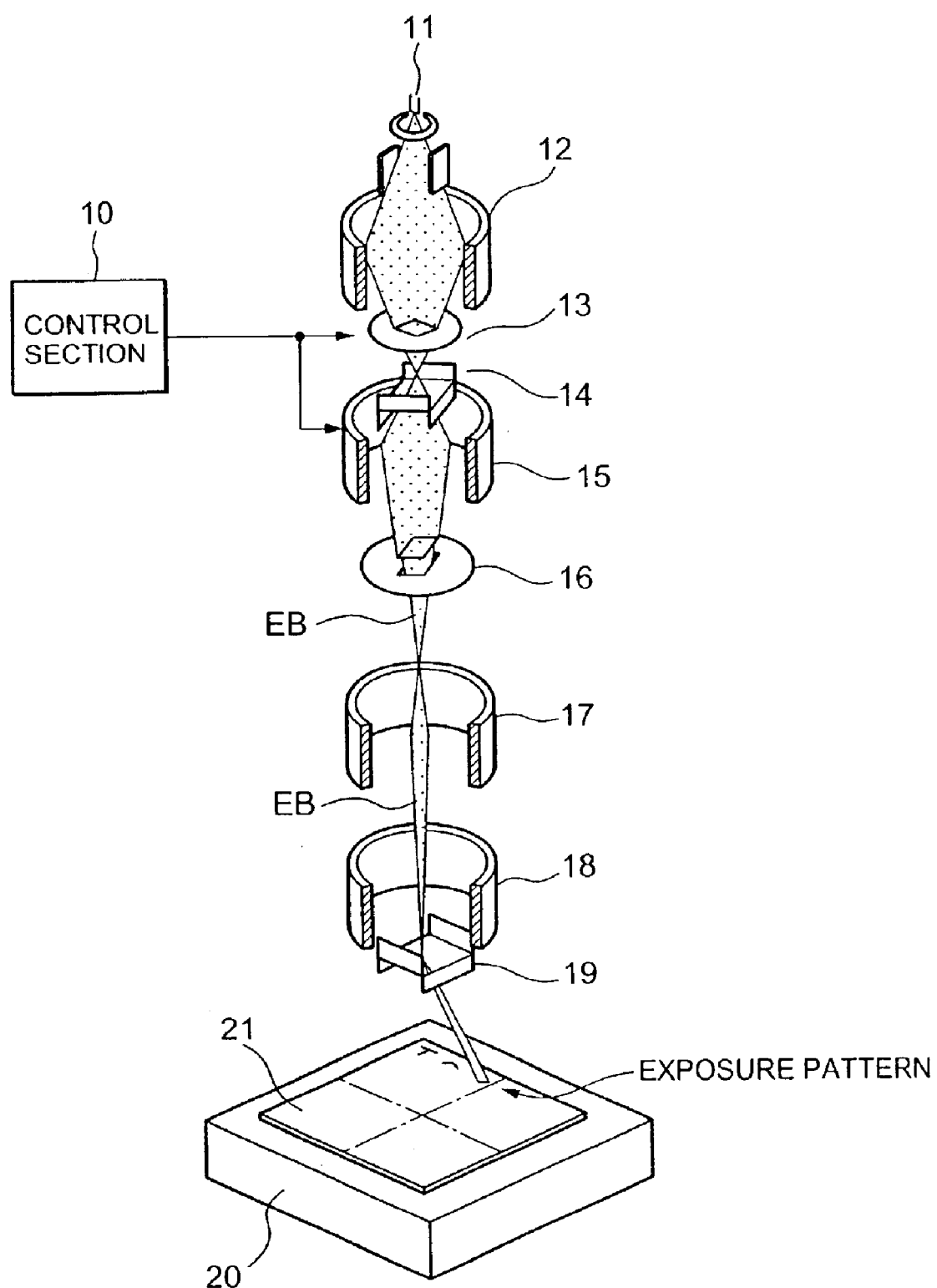
FIG. 3 is a conceptual configuration diagram of a variable shaped beam exposure system.

FIG. 3 is a schematic block diagram of a variable shaped beam exposure system. Electron beams emitted from an electron gun 11 are converged by an irradiation lens 12, Ebs passing through a first aperture 13 are deflected and condensed by a shaping and deflecting unit 14 and a shaping lens 15, and the beams are formed into a desired rectangular beam bundle by a second aperture 16. The bundle is reduced to a micro rectangular beam bundle by a reduction lens 17, and the beam is projected by a projection lens 18 and a deflector 19 onto a desired site of an exposure original plate 21, which will serve as a photo mask, placed on a stage 20. Here, the shaping and deflecting unit 14 and the shaping lens 15 are controlled based on the EB exposure data set in a control section 10, and an EB beam with a rectangular pattern corresponding to the EB exposure data is formed. Then, in cooperation with the XY movement of the stage 20, exposure in step and repeat fashion is carried out sequentially to the exposure original plate 21. Since beam blurring due to the optical proximity effect in the vicinity of the rectangular beam occurs with a width of about 0.1 $\mu$m in this variable shaped beam exposure system, the influence on the drawn pattern due to the optical proximity effect becomes inevitable when the size of the short side of the micro pattern is less than 0.1 $\mu$m, so that normal exposure of a micro pattern becomes impossible as mentioned above.

Figure 2A:
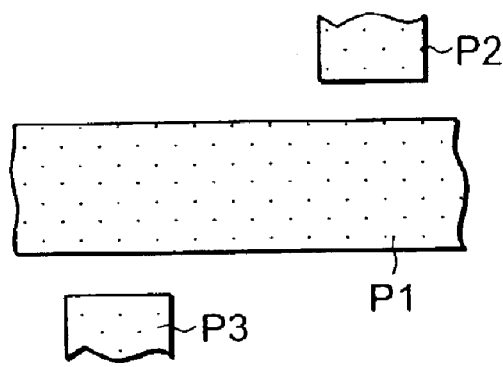
FIGS. 2A to 2E are respectively pattern diagrams showing specific examples of the processing of the first embodiment.
Figure 2D:
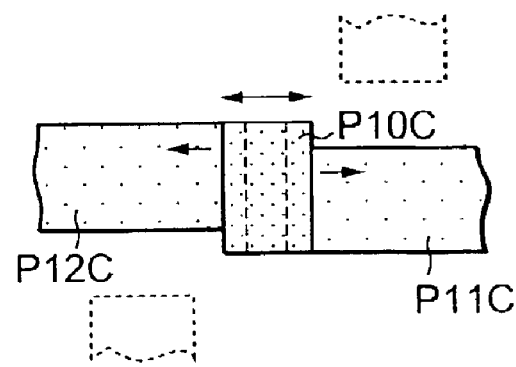
Figure 2B:
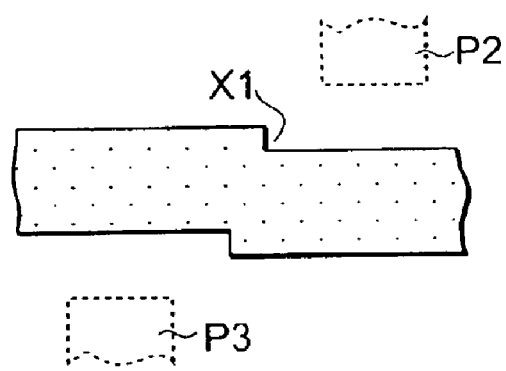
Figure 2E:
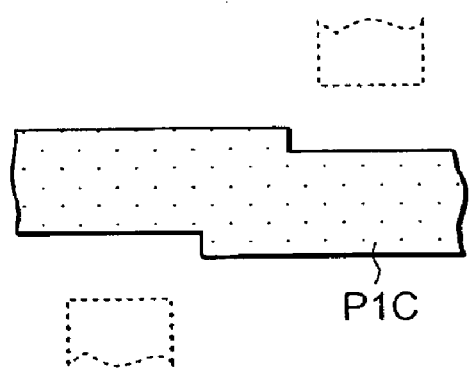
Figure 2C:
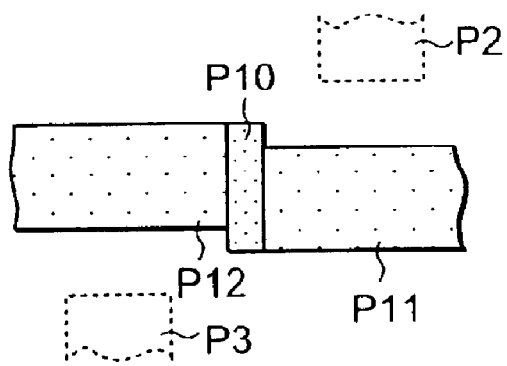

However, since the rectangular pattern of the micro pattern with a size smaller than 0.1 $\mu$m is subjected to a thickening processing to change it to a rectangular pattern of the corrected micro pattern with a side larger than 0.1 $\mu$m (here, it is larger than 0.2 $\mu$m), it is possible to eliminate the influence of the optical proximity effect by EB exposing the corrected micro pattern P10C and the corrected adjacent patterns P11C and P12C as shown in FIG. 2D by using such a variable shaped beam exposure system. Accordingly, when a corrected micro pattern and an adjacent, corrected adjacent pattern are exposed sequentially, it is possible to form a pattern which is in proper continuation of both patterns, and it is possible to prevent a pattern defect at the connection portion of the patterns.

Figure 4:
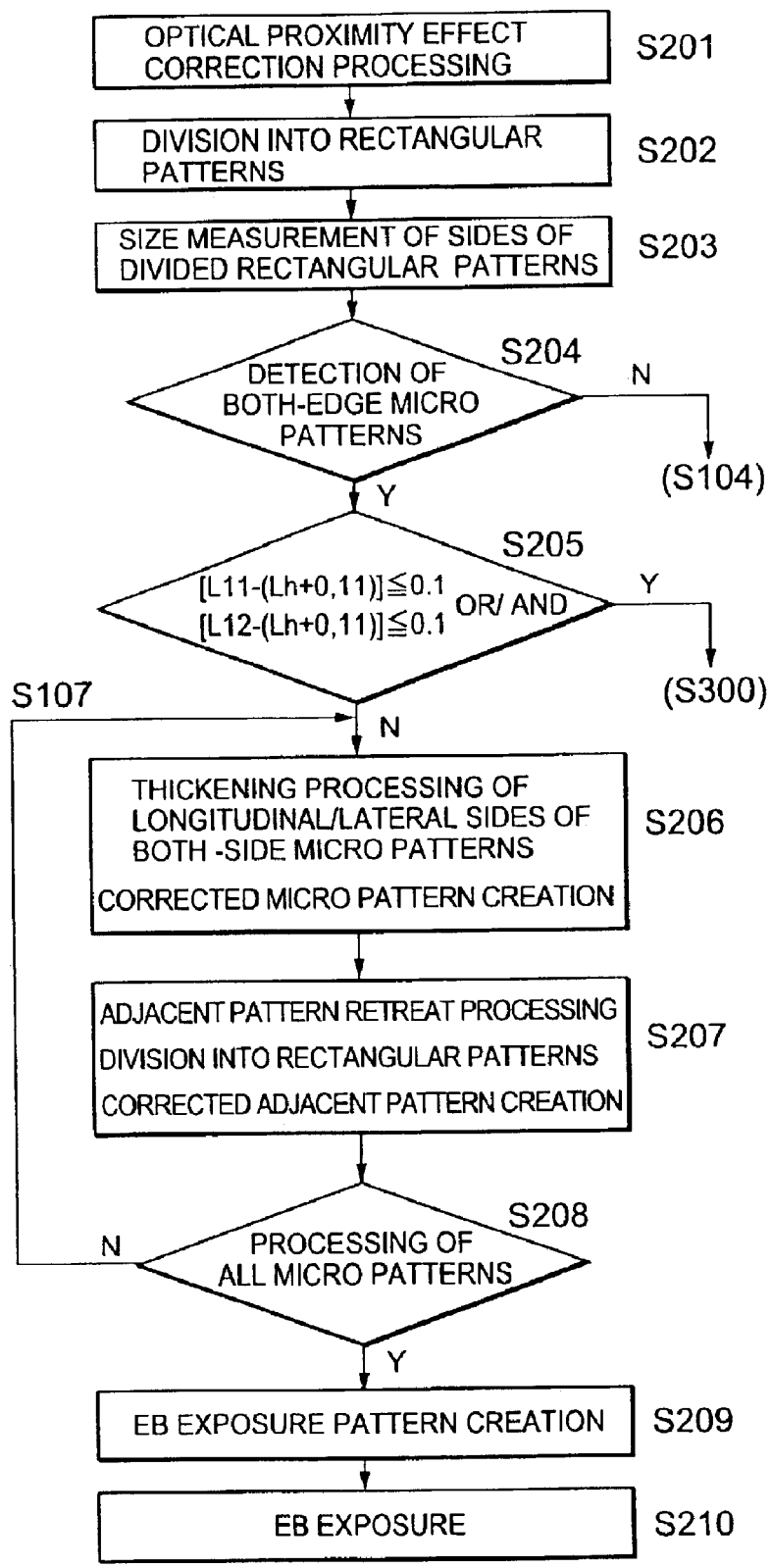
FIG. 4 is a flowchart of a second embodiment of the preparation method according to the invention.

FIG. 4 is a flowchart for a second embodiment of the invention. Similar to the first embodiment, an OPC by the bias method or the inner serif method is applied to mask data (S201). Next, the pattern obtained by the OPC is subdivided into a plurality of rectangular patterns (S202). Next, the size of the sides in the longitudinal and the lateral directions of each divided rectangular pattern is measured (S203), and rectangular patterns having a prescribed size (here, it is less than 0.1 $\mu$m) on both of the longitudinal and the lateral sides are extracted as both-edge micro patterns (S204). If a both-edge micro pattern is not extracted, it is moved to the processing in step S104 of the flowchart shown in FIG. 1 in the first embodiment, and micro patterns are extracted.

Figure 5A:
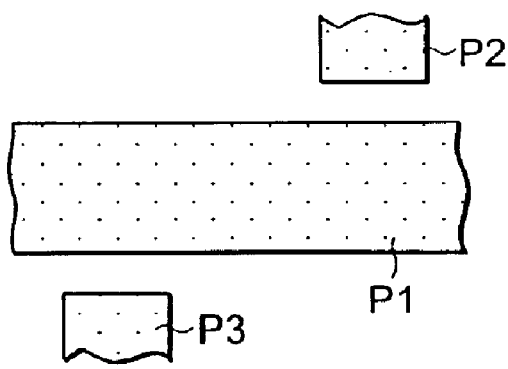
FIGS. 5A to 5E are respectively pattern diagrams showing specific example of the processing of the second embodiment.
Figure 5B:
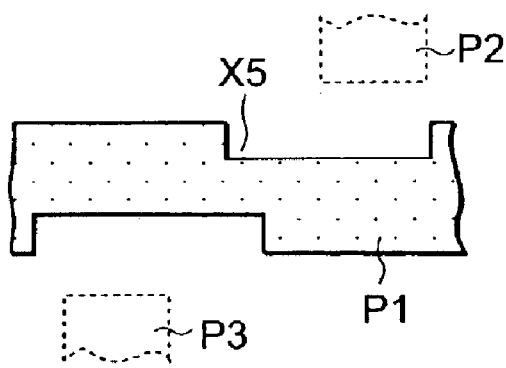
Figure 5C:
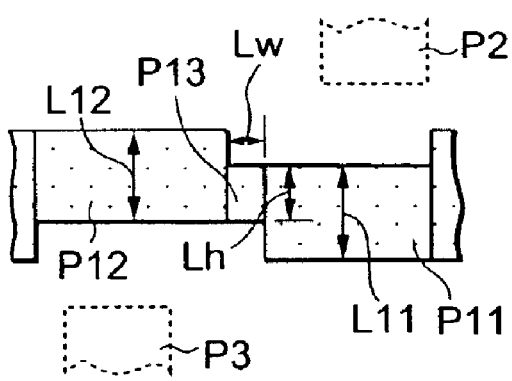

When both-edge micro patterns are extracted, it is determined if $[L11-(Lh+0.11)] \leq 0$ and/or $[L12-(Lh+0.11)] \leq 0$ is satisfied. Here, Lh is the width size of the both-edge micro pattern (length size is represented by Lw), and L11 and L12 are respectively the width sizes of the adjacent patterns that make contact with the both-edge micro pattern in the length direction. For example, referring to FIG. 5C or FIG. 7A of the embodiments to be described later, the width sizes of the adjacent patterns P11 and P12 are represented by L11 and L12, and the width size of the both-edge micro pattern P13, sandwiched by these adjacent patterns, is represented by Lh. By subtracting the sum of the width size Lh of the both-edge micro pattern and 0.11 from L11 and L12 it can be determined that the adjacent patterns are not micro patterns. When at least one of the above inequalities is satisfied, the processing moves to step S300 of FIG. 6 described later (S205). When the conditions are not satisfied, for the extracted both-edge micro pattern, a thickening processing is carried out in the longitudinal and the lateral directions for each side, without detecting presence or absence of the adjacent patterns, to create a corrected both-edge micro pattern having the size of each side larger than 0.1 $\mu$m, preferably larger than 0.2 $\mu$m (S206). Next, when there exists a pattern adjacent to the corrected both-edge micro pattern, corresponding to the thickening processing of the both-edge micro pattern, the common side of the adjacent pattern and the micro pattern is subtracted and retreated by the width of 0.1 $\mu$m from the adjacent patterns, and for the retreated side, rectangular division of inserting a cut in the short side direction of the adjacent pattern is applied to obtain a corrected adjacent pattern (S207). This processing is applied to all the both-edge micro patterns to create a corrected both-edge micro patterns (S208). Then, EB exposure data are prepared based on the corrected both-edge micro patterns, corrected adjacent patterns and the other patterns (S209), and EB exposure is executed by the variable shaped beam method using the EB exposure data.

FIG. 5 is a drawing showing a specific example of the pattern of a second embodiment. This is an example in which an OPC by the bias method is applied to a part of both sides of a linear wiring pattern P1 similar to that in the first embodiment as shown in FIG. 5A, and a thin width part X5 is generated in a part in the length direction of the wiring pattern as shown in FIG. 5B. When the pattern subjected to the OPC is subdivided into rectangular patterns, there is created a rectangular pattern P13 with small longitudinal and lateral sizes in the thin width part X5 as shown in FIG. 5C. When the longitudinal size Lh and the lateral size Lw are both less than 0.1 μm, the rectangular pattern P13 is extracted as a both-edge micro pattern. Next, for the both-edge micro pattern P13, the determination in step S205 in FIG. 4 is applied based on its relation with the width sizes L11 and L12 of the adjacent patterns P11 and P12. Since the conditions of step S205 are not satisfied in this case, all the sides of the both-edge micro pattern P13 are subjected to the thickening processing, each side of the both-edge micro pattern P13 is increased by 0.1 μm, as in FIG. 5D, to form a corrected both-edge micro pattern P13C with each of the longitudinal and lateral sides of a total of about 0.2 μm. Next, corresponding to the thickening processing of the micro pattern P13, the corresponding common sides, with P13, of the adjacent patterns P11 and P12 on both sides are retreated by a width of 0.1 μm respectively, to form corrected adjacent patterns P11C and P12C. Electron beam exposure data for the corrected both-edge micro pattern P13C and the corrected adjacent patterns P11C and P12C thus formed are prepared, and by carrying out exposure using the variable shaped beam exposure system based on the EB exposure data, EB exposure of pattern of FIG. 5E is executed.

In this way, since a corrected both-edge micro pattern having a rectangular pattern with longitudinal and lateral sizes less than 0.1 μm is changed here to a rectangular pattern with longitudinal and lateral sizes of about 0.2 μm by subjecting it to a thickening processing of more than 0.1 μm, so that it is possible to eliminate the influence of the optical proximity effect on the drawing pattern. Accordingly, when the corrected both-edge micro pattern and its adjacent pattern are exposed sequentially, it is possible to form a pattern in which both patterns are in properly continuous state, and a pattern defect at the connection portion can be prevented. At the same time, no EB exposure defect will be generated in the micro pattern in the direction perpendicular to the side which is making contact with the adjacent pattern, so that defect such as disconnection of a linear wiring can be prevented.

In the second embodiment, the processing of step S207, namely, the processing of retreating the common side which is making contact with the corrected both-edge micro pattern, of the adjacent pattern making contact with the corrected both-edge micro pattern, may be omitted, or the portion subjected to the thickening processing where the corrected both-edge micro pattern and the adjacent pattern are making contact may be subjected to a double exposure. No special problem will occur in the prepared pattern by such a modification. Moreover, since the adjacent pattern is not given a processing of retreating its side corresponding to the corrected both-edge micro pattern, it is possible to reduce the processing man-hours and shorten the processing time.

Figure 5D:
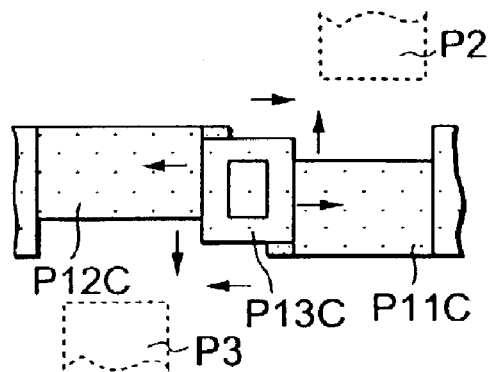
Figure 5E:
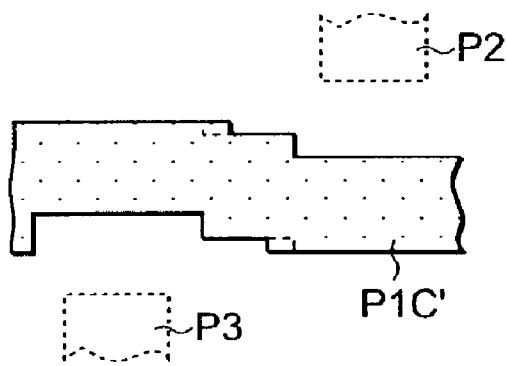
Figure 6:
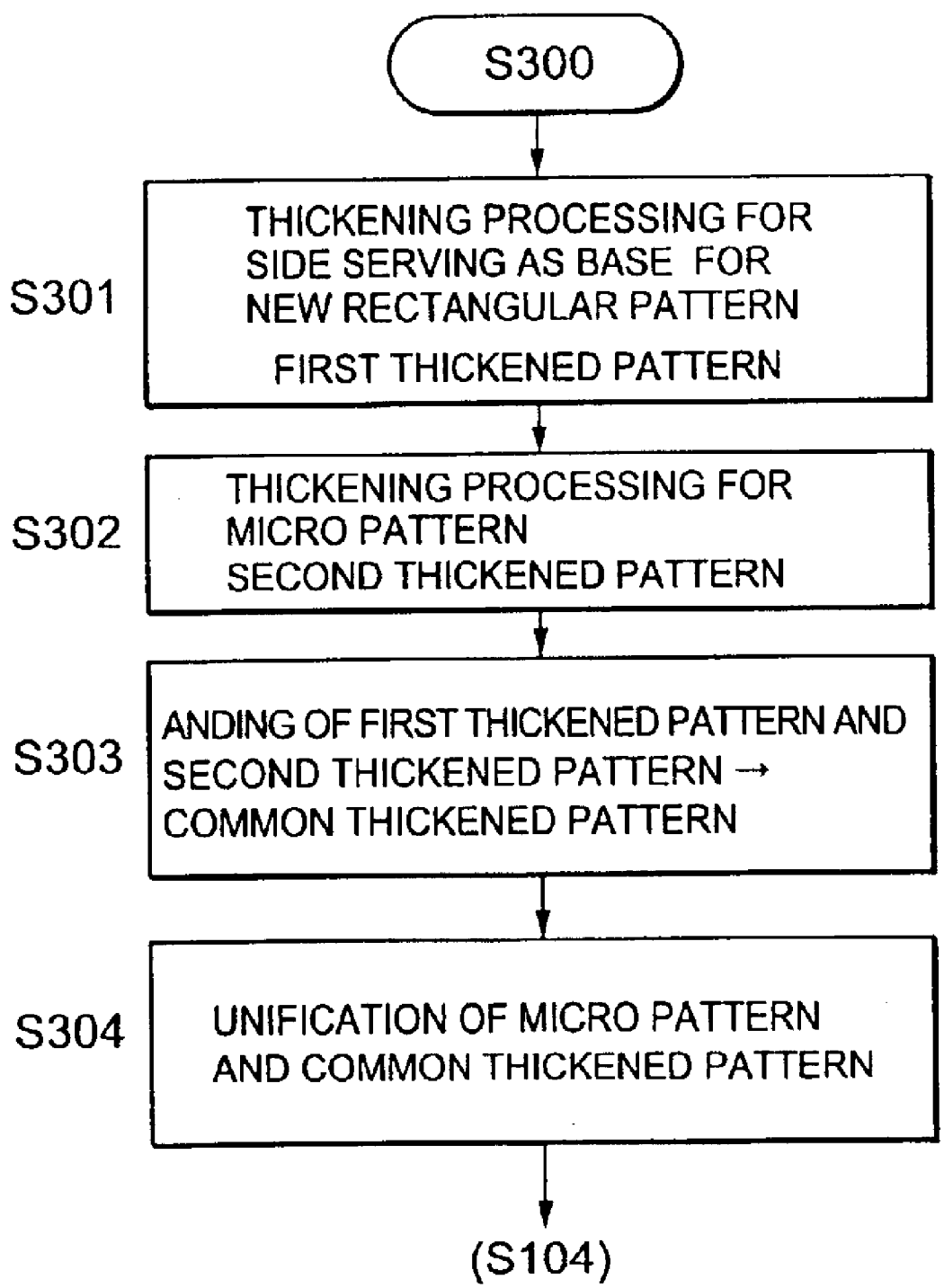
FIG. 6 is a flowchart of a third embodiment of the preparation method according to the invention.

Next, a modification in the processing of retreating the adjacent pattern, in the second embodiment, will be described as a third embodiment. Since the adjacent patterns P11 and P12 in FIG. 5D are subjected to a retreat processing in the second embodiment, there may occur a case in which the corners of the corrected both-edge micro pattern P13C are left behind. Then, a processing for correcting such a situation becomes necessary. A flowchart S300 for this purpose is shown in FIG. 6. When a both-edge micro pattern is detected in step S204 in FIG. 4 of the second embodiment, and the relations in step S205 are satisfied between the both-edge micro pattern and the adjacent patterns P11 and P12, in other words, when the longitudinal and lateral sizes are measured for the sides of a pattern to be the basis for the obtained new rectangular pattern, it is determined whether a side which becomes as the basis for a new micro pattern exists or not, and if there is found the existence of a side to be the basis for a new micro pattern, the processing flow moves to step S300 of the third embodiment, as mentioned above.

In the meantime, when the existence of a side that becomes the basis for the new micro pattern is found in step S205, the adjacent pattern is subjected to a thickening processing along the side of the micro pattern for the side where a new rectangular pattern is generated, to create a first thickened pattern (S301). In addition, the edge on the side where the new rectangular pattern is created, among the four sides of the micro pattern, is subjected to a thickening processing to the region including the new rectangular pattern, to create a second thickened pattern (S302). After that, the common thickened pattern is extracted by taking the logical product of (ANDing) the first thickened pattern and the second thickened pattern (S303), and a micro pattern is created newly by unifying the result of the logical product and the old micro pattern (S304). Thereafter, the processing returns to step S104 of the second embodiment, creates a corrected one-edge micro pattern for a second time, and the processing continues to EB exposure.

Figure 7A:
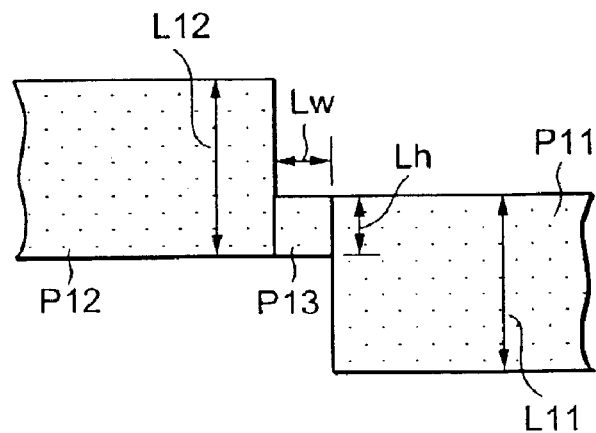
FIGS. 7A to 7C are respectively part 1 of pattern diagrams showing specific examples of the processing of the third embodiment.
Figure 7B:
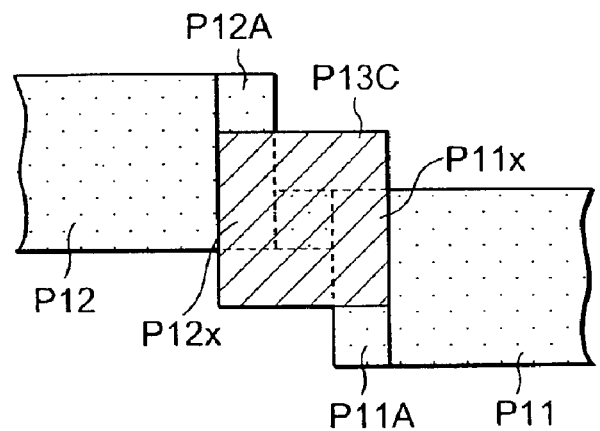
Figure 7C:
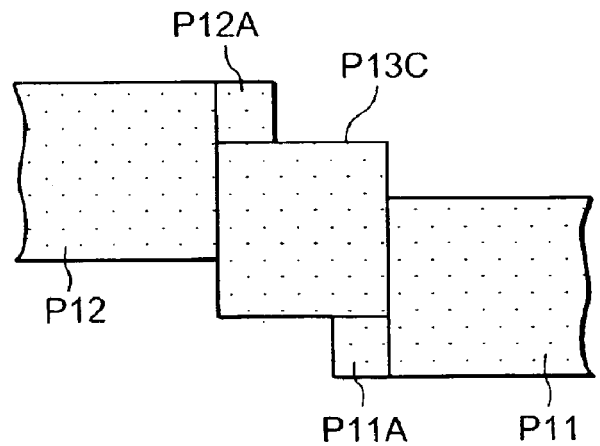

FIG. 7 is a drawing showing a specific example of the pattern of a third embodiment. After division processing into rectangular patterns, and creation of a both-edge micro pattern P13 and adjacent patterns P11 and P12 as shown in FIG. 7A, a corrected both-edge micro pattern P13C is formed by subjecting the both-edge micro pattern P13 as shown in FIG. 7B. By carrying out division into rectangles by removing the overlapping portions P11x and P12x of the adjacent patterns P11 and P12 with the corrected both-edge micro pattern P13C from the adjacent patterns P11 and P12, there are generated new rectangular patterns P11A and P12A of new extended shape. When the longitudinal size of the adjacent patterns P11 and P12 are called L11 and L12, and the longitudinal and lateral sizes of the both-edge micro pattern P13 are called Lh and Lw, since the longitudinal and lateral sizes of the corrected both-edge micro pattern P13C when it is subjected to a thickening processing of 0.11 μm are (Lh+0.11 μm) and (Lw+0.11 μm), respectively, the longitudinal sizes of the new rectangular patterns P11A and P12A are given by [L11−(Lh+0.11)] and [L12−(Lh+0.11)], respectively. Accordingly, if these longitudinal sizes are larger than 0.1 μm, the new rectangular patterns are not classified as micro patterns, and EB exposure is possible by treating them as independent rectangular patterns.

Figure 8A:
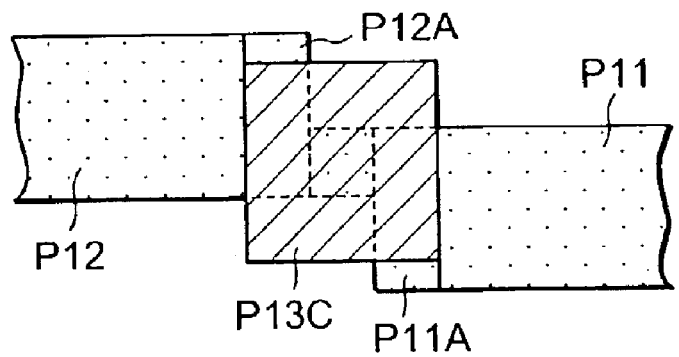
FIGS. 8A to 8D are respectively part 2 of pattern diagrams showing specific examples of the processing of the third embodiment.
Figure 8B:
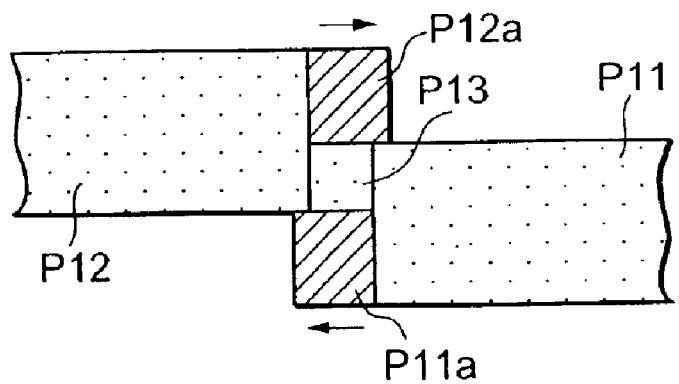
Figure 8C:
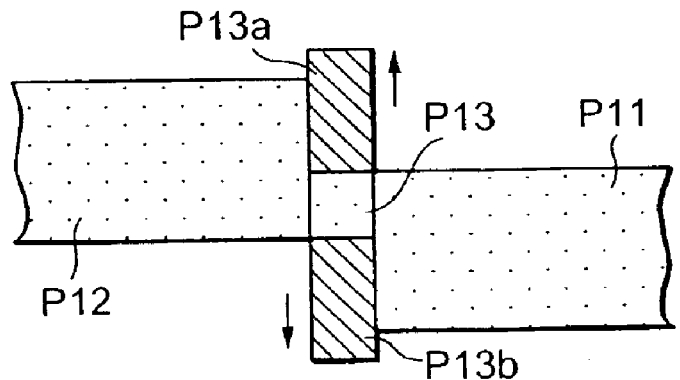
Figure 8D:
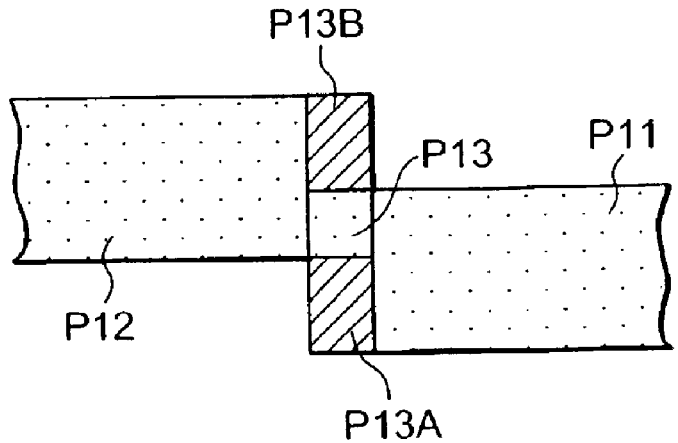

In the meantime, if the longitudinal sizes [L11−(Lh+0.11)] and [L12−(Lh+0.11)] of the new rectangular patterns P11A and P12A are respectively smaller than 0.1 μm, the new rectangular patterns P11A and P12A are classified as micro patterns. For this reason, the thickening processing for the both-edge micro pattern P13 is withdrawn and the processing is returned to the state in FIG. 7A. Then, adjacent patterns P11 and P12 are subjected to a thickening processing of 0.11 μm along the lateral side direction of the both-edge micro pattern P13, for their longitudinal sides making contact with, but not overlapping with, the both-edge micro pattern P13, to create first thickened patterns P11a and P12a as shown in FIG. 8B. In addition, separately from the above, a thickening processing is executed for the both-edge micro pattern P13 only in the longitudinal direction as shown in FIG. 8C. In the thickening processing, in order to have [L11−(Lh+0.11)] and [L12−(Lh+0.11)] to be larger than 0.1 µm, the longitudinal size of the both-edge micro pattern P13 is extended to the above and below, respectively, in the longitudinal direction by 0.2 µm, to create second thickened patterns P13a and P13b. After that, logical product between the first thickened patterns P11a, P12a and the second thickened patterns P13a and P13b are taken, and common thickened patterns P13A and P13B are obtained as shown in FIG. 8D. Then, the common thickened patterns P13A and P13B are unified with the both-edge micro pattern P13, a corrected one-edge micro pattern is created for the obtained one-edge micro pattern (P13 +P13A +P13B) for a second time, and EB exposure is executed with the obtained result treated as an independent rectangular pattern thereafter. According to the third embodiment, missing of the pattern at the corners of the corrected both-edge micro pattern P13C that occurred in the second embodiment can be prevented, and more satisfactory pattern exposure becomes possible. Although description is given in FIG. 8 assuming that both of the new rectangular patterns P11A and P12A are micro patterns, the thickening processing is required only for one pattern alone if only one of them is a micro pattern.

Figure 9:
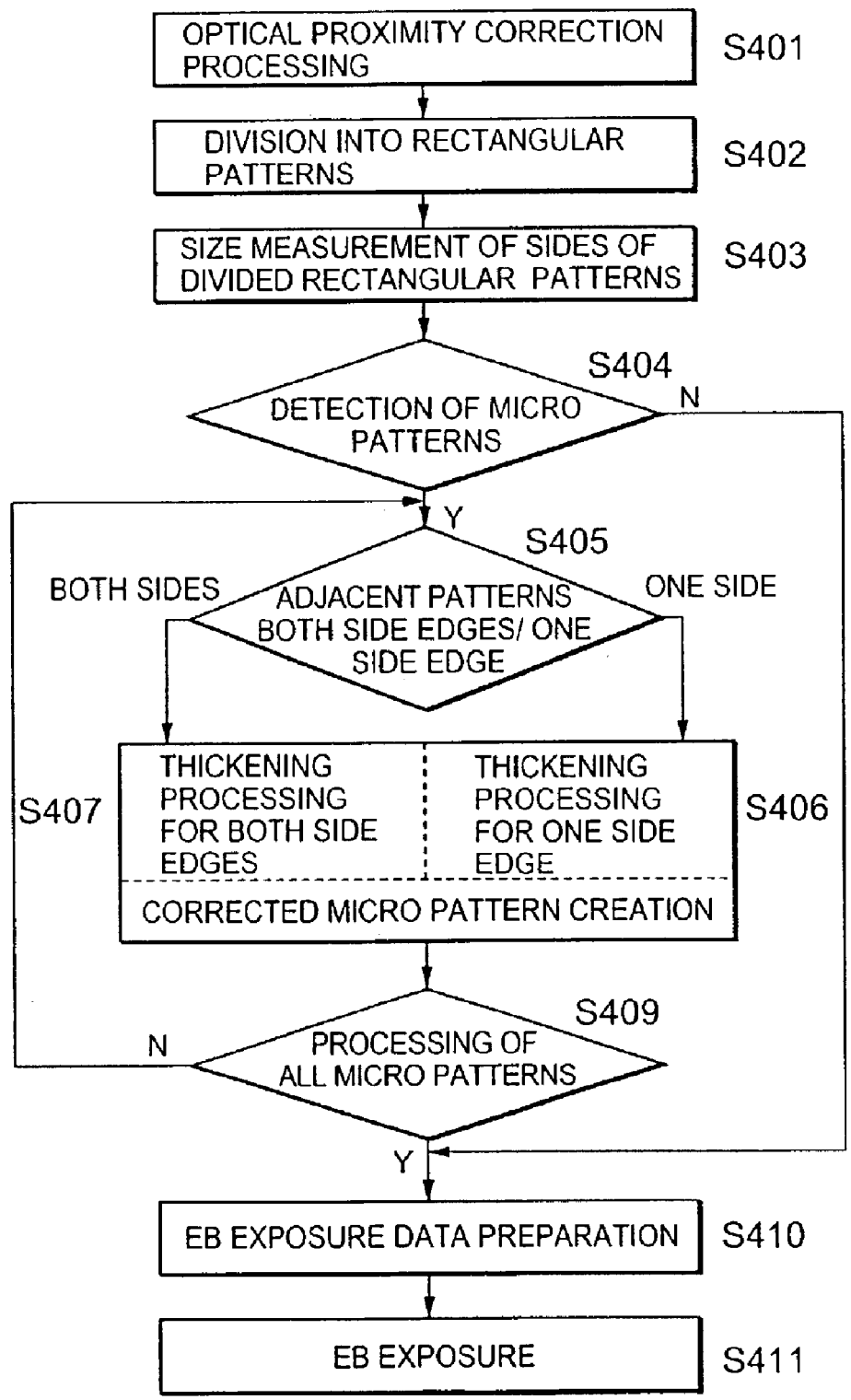
FIG. 9 is a flowchart of a fourth embodiment of the preparation method according to the invention.
Figure 10A:
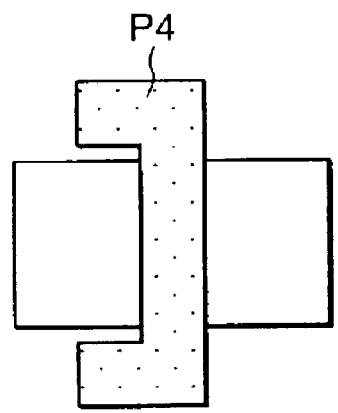
FIGS. 10A to 10E are respectively pattern diagrams showing specific examples of the processing of the fourth embodiment.
Figure 10B:
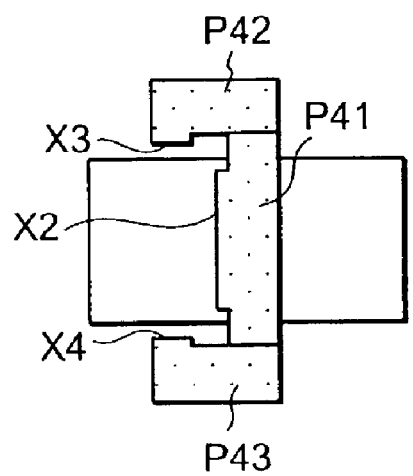
Figure 10C:
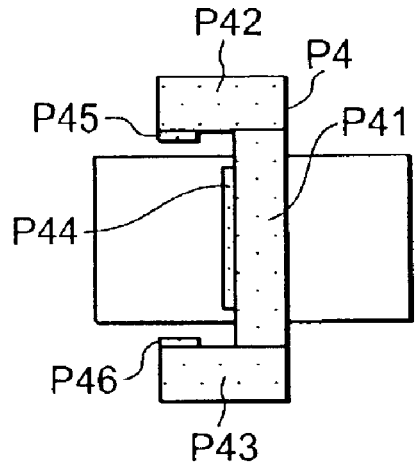
Figure 10D:
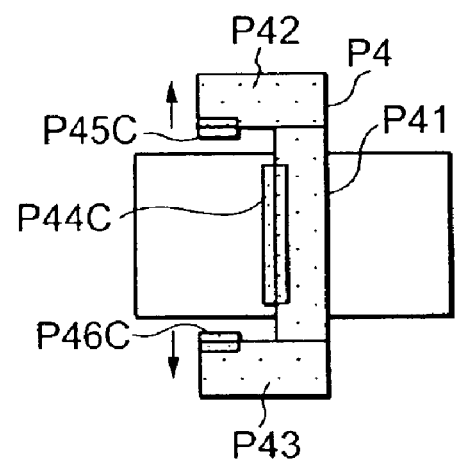
Figure 10E:
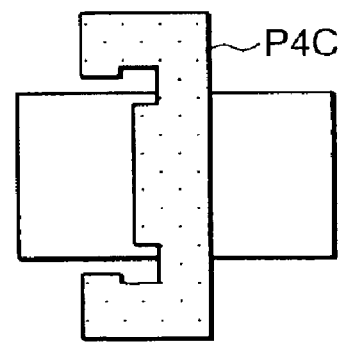

FIG. 9 is a flowchart of a fourth embodiment of the invention. Analogous to the first embodiment, an OPC according to the bias method or the inner serif method is applied to mask data (S401). Next, the pattern obtained by the OPC is subdivided into a plurality of rectangular patterns (402). Then, the size of respective sides is detected for each of the divided rectangular pattern (S403), and rectangular patterns having the size of the shortest length less than a prescribed value (here it is 0.1 µm) are extracted as micro patterns (S404). When a micro pattern is not detected, processing is moved to step S410 to be described later. When a micro pattern is extracted, it is determined for the micro pattern whether the long edge that makes contact with an adjacent pattern in the direction of the short edge occurs on one side edge or occur on both side edges (S405). What is meant by the case of one side edge is the case in which the micro pattern is in contact with the edge of an adjacent pattern on only one side, and the case of both side edges means that the micro pattern makes contact with adjacent patterns on both sides.

Next, the micro pattern is subjected to a thickening processing of more than 0.1 µm in the width direction for the long side making contact with an adjacent pattern, to create a corrected micro pattern having the size of a short side preferably longer than 0.2 µm. In this case, thickening processing is carried out for only one long edge on one side of the micro pattern for the case of one side edge (S406), and thickening processing is carried out for both long edges in the case of both side edges (407). A corrected micro pattern is formed after repeating the above processing for all the micro patterns (S409). After that, EB exposure data are prepared based on the corrected micro pattern and the other pasterns including adjacent patterns (S410), and EB exposure is executed by the variable shaped beam method using the EB exposure data (S311).

FIG. 10 is a drawing showing a specific example, corresponding to the example shown in FIG. 15, of the pattern according to a fourth embodiment. Here, an OPC by the inner serif method is applied to a U-shaped gate electrode pattern P4, and protrusions X2, X3 and X4 are generated on the inner face side of respective sides P41, P42 and P43 as shown in FIG. 10A. By dividing the pattern into rectangular patterns, rectangular patterns P44, P45 and P46 with micro width are created in protrusions X2, X3 and X4, respectively, as shown in FIG. 10B. Since the width sizes of the rectangular patterns P44, P45 and P46 are assumed to be less than 0.1 µm here, the rectangular patterns P44, P45 and P46 are extracted as micro patterns. Next, from the connection conditions of the micro patterns P44, P45 and P46 with the adjacent patterns P41, P42 and P43, since the micro patterns P44, P45 and P46 make contact with the adjacent rectangular patterns P41, P42 and P43 only on one side edge, thickening processing is executed for the one side edges of the micro patterns P44, P45 and P46 that are making contact, increasing the width of the edges on one side of each micro pattern by 0.1 µm, forming corrected micro patterns P44C, P45C and P46C with a total width size of about 0.2 µm. Then, EB exposure data are prepared for the corrected micro patterns P44C, P45C and P46C thus obtained, and the adjacent patterns P41, P42 and P43, and a gate electrode pattern P4C as shown in FIG. 10D is obtained by EB exposure by carrying out exposure using the variable shaped beam exposure system based on the EB exposure data.

Since the rectangular pattern with size of less than 0.1 µm of the micro pattern is subjected to thickening processing of more than 0.1 µm to form a rectangular pattern of more than 0.2 µm here, it is possible to eliminate the influence of the optical proximity effect on the drawn pattern. Accordingly, when the corrected micro pattern and the corrected adjacent pattern making contact with it are exposed sequentially, it is possible to form a pattern in which both patterns are in a properly continuous condition, so that generation of pattern defects at the connection portion of the patterns can be prevented. Here, it is to be noted in this embodiment that the corrected micro pattern overlaps with the adjacent pattern in the portions where its width is increased, so that the so-called double exposure takes place there, but no special problem will arise in the prepared pattern. Moreover, since the processing of retreating the side of the adjacent pattern corresponding to the corrected micro pattern is not applied in this embodiment, it is possible to reduce the processing man-hours and shorten the processing time compared with the first embodiment.

Figure 11:
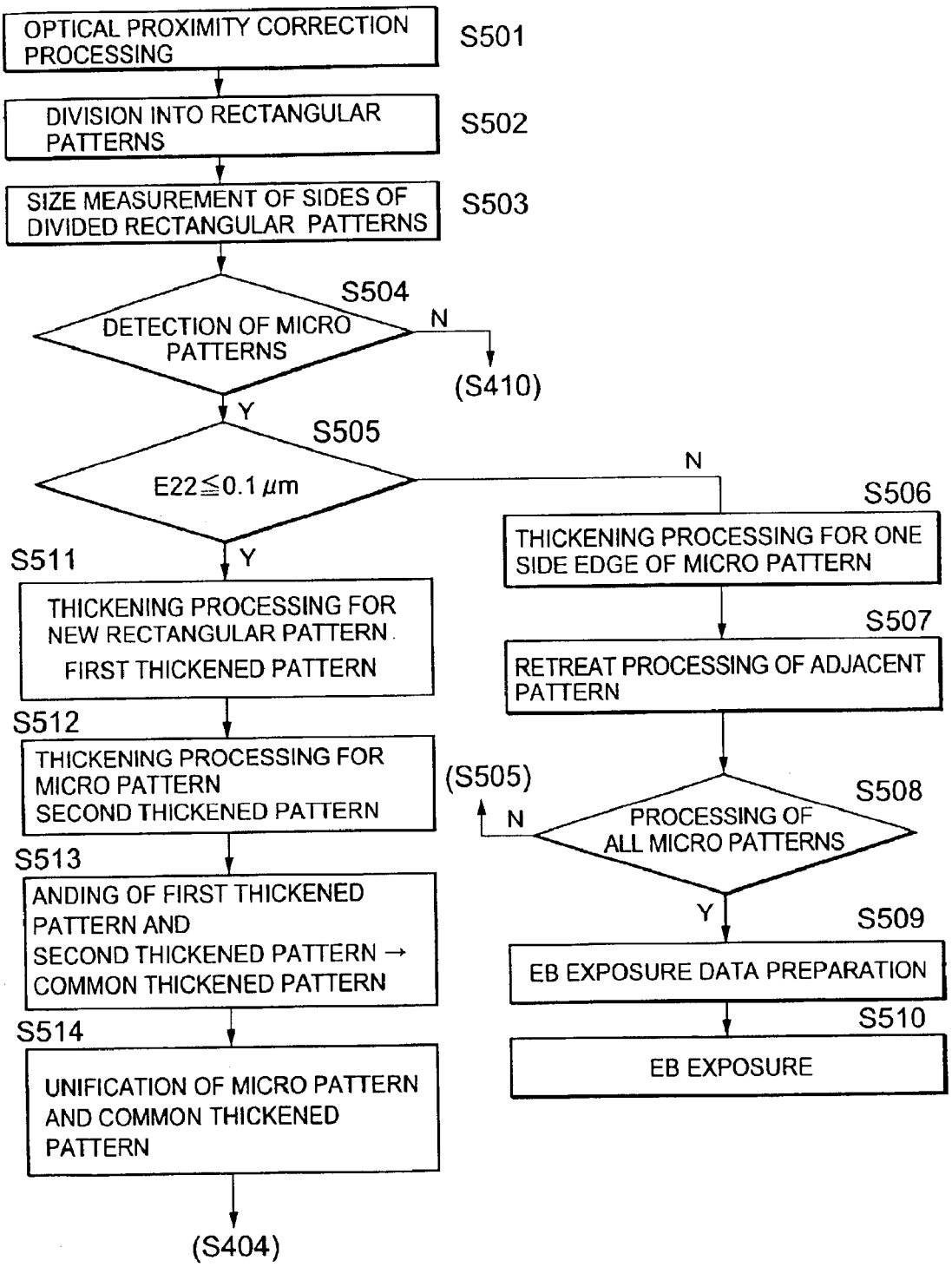
FIG. 11 is a flow chart of a fifth embodiment of the preparation method according to the invention.

FIG. 11 is a flowchart of a fifth embodiment in which retreat processing is applied to the adjacent patterns in the fourth embodiment. Analogous to the fourth embodiment, an optical proximity effect correction processing S501, a rectangular pattern division S502, a size measurement of sides of divided rectangular patterns S503 and a micro pattern detection S504 are carried out. When no micro pattern is detected, the processing moves to step S410 of the fourth embodiment shown in FIG. 9. When some of the divided rectangular pattern are detected as micro patterns, the size of the smallest side E22 of all sides of the new rectangular patterns, except for the above micro patterns, is measured to determine whether it is less than 0.1 µm or not (S505). If the size of the side E22 is larger than 0.1 µm, since new micro patterns will not be generated from the newly divided rectangular patterns, a thickening processing is applied to the one side edge of the micro pattern (S506), and the adjacent pattern is subjected to a retreat processing corresponding to the amount of the thickening (S507). Processing from step S505 is repeated until it is applied to all the micro patterns (S508), and thereafter, preparation of EB exposure data (S509) and EB exposure (S510) are executed.

On the other hand, when it is found in step S505 that the size of the side E22 of the new rectangular pattern is less than 0.1 μm, the new rectangular pattern found to be a micro pattern is subjected to a thickening processing in the length direction of the new micro pattern to form a first thickened pattern (S511). In addition, a thickening processing is applied to the micro pattern along the side E22 of the new rectangular pattern that is determined to be a new micro pattern to form a second thickened pattern (S512). Then, logical product between the first thickened pattern and the second thickened pattern is taken to obtain the common thickened pattern (S513). After that, a new micro pattern is created by unifying the common thickened pattern and the micro pattern (S514) Accordingly, since the new micro pattern includes a rectangular pattern generated in step S502, the processing moves to step S406 of the fourth embodiment, and a corrected micro pattern is formed for a second time.

Figure 12A:
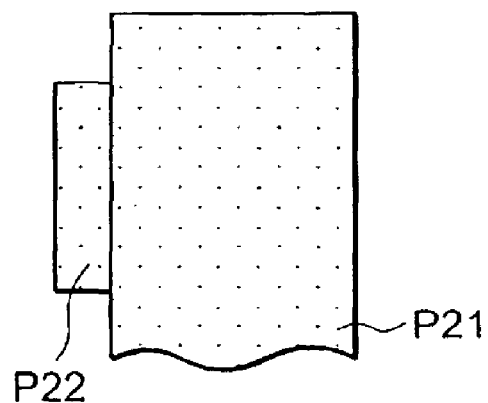
FIGS. 12A to 12C are respectively part 1 of pattern diagrams showing specific examples of the processing of the fifth embodiment.
Figure 12B:
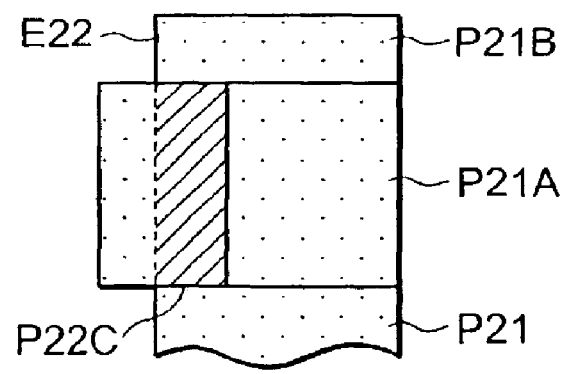
Figure 12C:
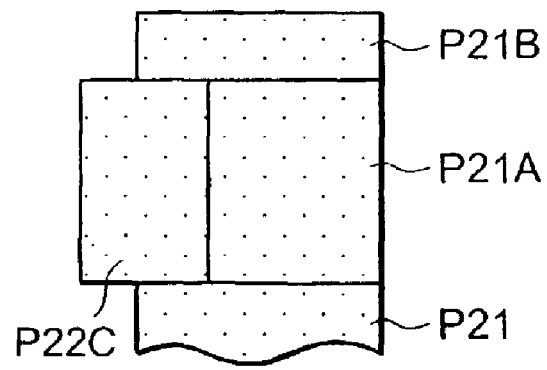

FIG. 12 is a drawing showing a specific example of the pattern of the fifth embodiment. Here, it is showing an example in which an OPC according to the bias method is applied to a linear wiring pattern P21, and a micro pattern P22 is generated on one side of the wiring pattern when it is subdivided into rectangular patterns. The generated micro pattern P22 is subjected to a thickening processing with respect to one side edge of the adjacent pattern P21 to form a corrected micro pattern P22C Then, the overlapped portion of the adjacent pattern P21 and the corrected micro pattern P22C is deleted from the adjacent pattern P21, and when the remaining adjacent pattern P21 is divided into rectangles, new rectangular patterns P21A and P21B are formed in parts of the adjacent pattern P21 as shown in FIG. 12B. The size of the smallest side E22 of the new rectangular patterns P21A and P21B formed newly is measured. If it is larger than 0.1 μm, it is not classified as a micro pattern, and its exposure becomes possible. In the case of FIG. 12C, neither of the new rectangular patterns P21A and P21B is classified as a micro pattern, and hence, the corrected micro pattern P22C and the new rectangular patterns P21A and P21B can be EB exposed as independent rectangular patterns.

Figure 13A:
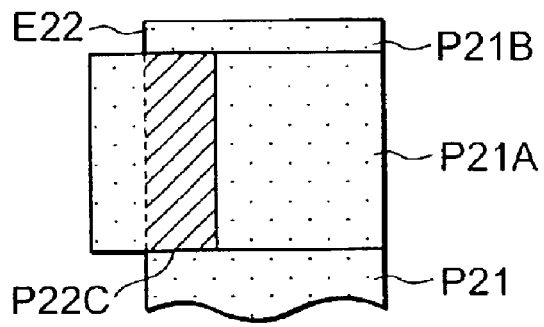
FIGS. 13A to 13D are respectively part 2 of pattern diagrams showing specific examples of the processing of the fifth embodiment.
Figure 13B:
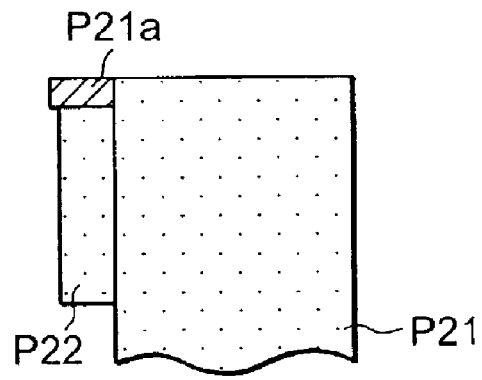
Figure 13C:
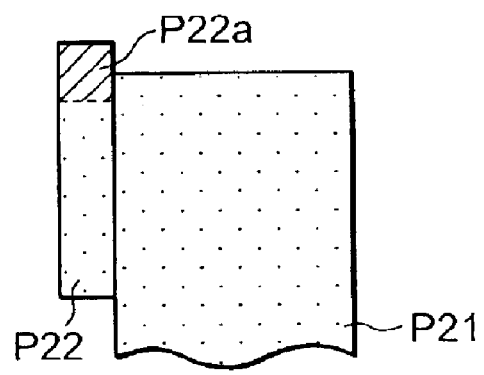
Figure 13D:
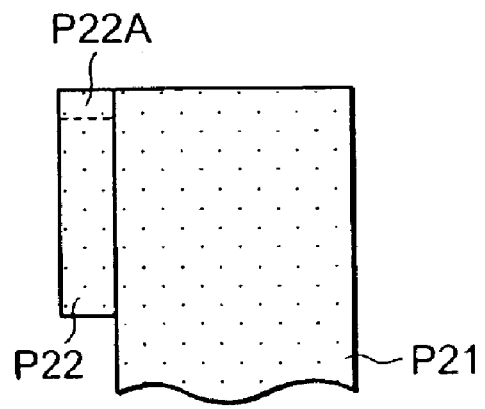
Figure 14A:
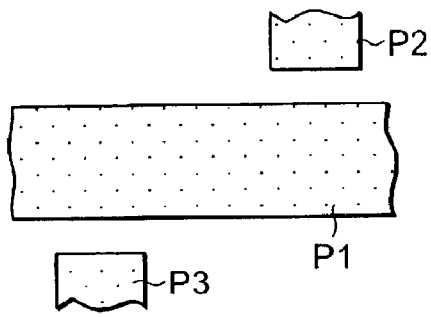
FIGS. 14A to 14D are respectively pattern diagrams for showing the OPC by the conventional bias method and its problems.
Figure 14B:
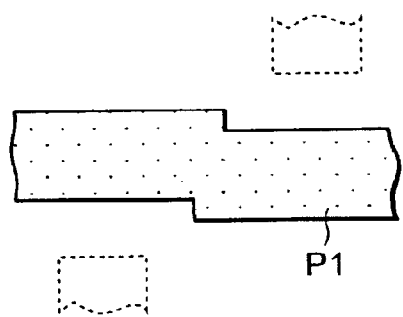
Figure 14D:
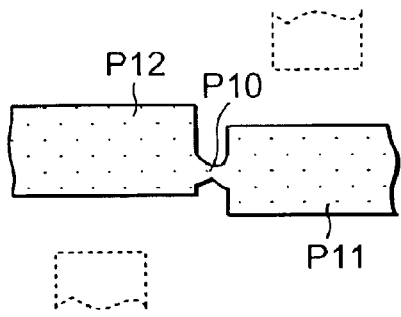
Figure 14C:
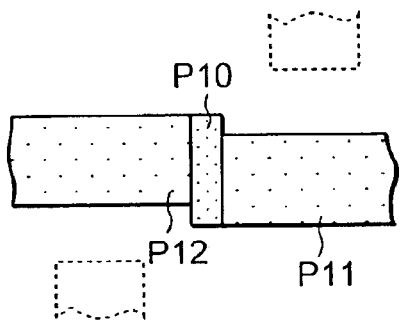
Figure 15A:
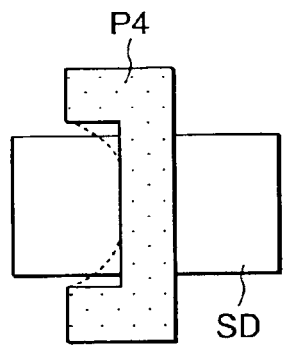
FIGS. 15A to 15D are respectively pattern diagrams for showing the OPC by the conventional inner serif method and its problems.
Figure 15C:
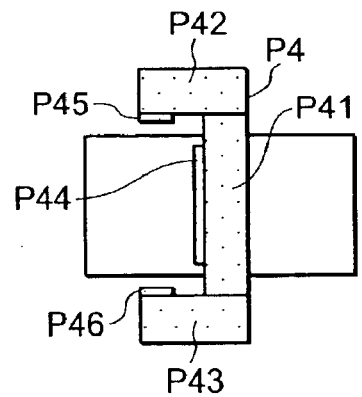
Figure 15B:
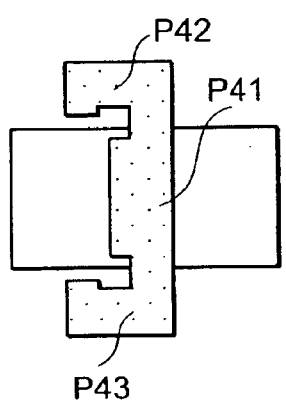
Figure 15D:
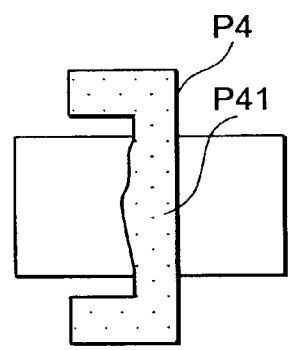

On the other hand, when the size of the side E22 of the new rectangular pattern is less than 0.1 μm, either one of these new rectangular patterns will become a micro pattern. FIG. 13A shows an example in which the new rectangular pattern P21B is generated as a micro pattern. Under such a condition, division into rectangles is withdrawn, and a thickening processing is applied along the lateral side of the micro pattern P22 as shown in FIG. 13B, with respect to the side E22 of the new rectangular pattern P21B recognized as a micro pattern in FIG. 13A, to form a first thickened pattern P21a. In addition, as for the micro pattern P22, a thickening processing is carried out along the side E22 of the new rectangular pattern P21B to generate a second thickened pattern P22a as shown in FIG. 13C. Then, the logical product of the first thickened pattern P21a and the second thickened pattern P22a is taken, to obtain the common thickened pattern P22A as shown in FIG. 13D. The common thickened pattern P22A is unified with the micro pattern P22, and a thickening processing is executed using a new micro pattern (P22+P22A) to generate a corrected micro pattern, and EB exposure is executed. According to the fifth embodiment, when rectangular patterns are generated anew in the adjacent pattern in the generation of the corrected micro pattern, it is possible to prevent new generation of micro patterns.

The embodiments in the above are examples of the present invention, and needless to say, specific examples of the patterns to which the present invention is applicable are not limited to the first to the third embodiments. For example, the manufacturing method of the second embodiment is applicable to the pattern described in the first embodiment, and conversely, the manufacturing method described in the first embodiment is applicable to the pattern described in the second embodiment. Moreover, although the embodiments are described in conjunction with examples in which the influence of the optical proximity effect in the EB exposure system appears for a size of 0.1 μm, when an original plate for exposure is prepared using an EB exposure system in which the influence of the optical proximity effect appears at a larger or a smaller value than 0.1 μm, what one is required to do is to simply modify the relevant size in respective embodiments.

As described in the above, according to the present invention, in dividing a pattern into rectangular patterns and EB exposing the divided rectangular patterns onto an exposure original plate by using a variable shaped beam exposure system, through extraction of micro patterns, and subjecting the micro patterns to a thickening processing by which the minimum size of the extracted micro patterns is changed to a size larger than a size for which the influence of the optical proximity effect does not appear, the influence of the optical proximity effect on the exposed pattern in EB exposure of each rectangular pattern by the variable shaped beam exposure system is eliminated, and makes it possible to form a normal pattern on an exposure original plate by proper EB exposure of the micro patterns. In this way, when an exposure original plate is prepared by EB exposure of the pattern obtained by the OPC, it is possible to prevent pattern defect in the prepared exposure original plates and prevent generation of abnormality in the characteristics of semiconductor devices manufactured by using the exposure original plate.

Although the invention has been described with reference to specific embodiments, this description is not meant to be construed in a limited sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A preparation method of an exposure original plate, comprising:
   subdividing a pattern constituting an exposure original plate into a plurality of rectangular patterns;
   extracting at least one micro pattern having a side with a size smaller than a prescribed value from among the plurality of rectangular patterns;
   forming a corrected micro pattern for the extracted micro pattern in which a size of a side of the extracted micro pattern perpendicular to another side of the extracted micro pattern making contact with an adjacent pattern is increased by at least the prescribed value;
   correcting the adjacent pattern, to form a corrected adjacent pattern, by retreating the side of the adjacent pattern which has been in contact with said corrected micro pattern by said prescribed amount of increase;
   finding Electron Beam (EB) exposure data for a pattern including said corrected micro pattern and said corrected adjacent pattern, and carrying out EB exposure by the variable shaped exposure system based on the EB exposure data.

2. The preparation method of an exposure original plate as claimed in claim 1, further comprising:

determining whether or not there exists a side of one of at least one of the plurality of rectangular patterns which becomes the basis for a new micro pattern, when the pattern is subdivided into the plurality of rectangular patterns;

withdrawing the formation of said corrected micro pattern when it is found that there exists a side of at least one of the plurality of rectangular patterns which becomes the basis for the new micro pattern;

creating a first thickened pattern for the new micro pattern by increasing the size of the side which served as the basis for the new micro pattern;

creating a second thickened pattern by increasing the size of a side of one of said micro patterns adjacent to the new micro pattern;

creating a common thickened pattern by taking a logical product of said first and second thickened patterns;

creating another corrected micro pattern to replace the corrected micro pattern, by combining the common thickened pattern and remaining portions of said micro pattern.

3. The preparation method of an exposure original plate as claimed in claim 2, wherein in the step of correcting the adjacent pattern to form the corrected adjacent pattern, for a case when there does not exist a side of any of said plurality of rectangular patterns which becomes the basis for said micro pattern, the retreated side of said corrected adjacent pattern is extended to an end position in a short side direction of the adjacent pattern to be given a notch at the end position.

4. A preparation method of an exposure original plate comprising:

subdividing a pattern constituting an exposure original plate into a plurality of rectangular patterns;

extracting at least one micro pattern having a side smaller than a prescribed size from among the plurality of rectangular patterns;

forming a corrected micro pattern by increasing a size of a side of the extracted micro pattern perpendicular to another side of the extracted micro pattern which is making contact with an adjacent pattern at least by the prescribed size;

finding Electron Beam (EB) exposure data for a pattern including said corrected micro pattern and said adjacent pattern, and carry carrying out exposure by a variable shaped exposure method system based on the EB exposure data.

5. The preparation method of an exposure original plate as claimed in claim 1, wherein said micro pattern is a rectangular pattern with a micro width, which is making contact with adjacent patterns on both edges in a width direction of said micro pattern, and in the step of forming said correction micro pattern, the micro pattern is subjected to a processing of increasing a width size in said width direction on both sides of the micro pattern.

6. The preparation method of an exposure original plate as claimed in claim 1, wherein said micro pattern is a rectangular pattern with a micro width which is making contact with an adjacent pattern on one edge of said micro pattern in the width direction, and in the step of forming said corrected micro pattern, the micro pattern is subjected to a processing of increasing a width size in the width direction on one side of the micro pattern.

7. The preparation method of an exposure original plate as claimed in claim 1, wherein said micro pattern is a rectangular pattern with a micro width and a micro length which is making contact with adjacent patterns on edges on both sides in a width direction of said micro pattern, and in the step of forming said corrected micro pattern the micro pattern is subjected to a processing of increasing the size of the micro pattern toward both edges in the width direction and toward both edges in the length direction of the micro pattern, respectively.

8. The preparation method of an exposure original plate as claimed in claim 1, wherein said step of extracting a micro pattern is on the basis of a minimum size at which EB exposure by the variable shaped exposure system which performs variable shaped beam exposure is possible in view of the optical proximity effect, and extracts a pattern with a size smaller than said minimum size as a micro pattern.

9. The preparation method of an exposure original plate as claimed in claim 1, wherein said step of forming the corrected micro pattern is a step of increasing the size of the side of said micro pattern to a size of side larger than a minimum size of said variable shaped beam exposure system that carries out the EB exposure.

10. The preparation method of an exposure original plate as claimed in claim 9, wherein said minimum size is 0.1 $\mu$m and the size of the side of said corrected micro pattern is increased to a size larger than 0.2 $\mu$m.

11. The preparation method of an exposure original plate as claimed in claim 1, wherein the pattern constituting said exposure original plate is a pattern to which an optical proximity correction is applied to a pattern based on design data.

12. The preparation method of an exposure plate as claimed in claim 11, wherein said optical proximity effect correction is at least an optical proximity effect correction by a bias method or an optical proximity effect correlation by an inner serif method.

13. The preparation method of an exposure original plate as claimed in claim 4, wherein said micro pattern is a rectangular pattern with a micro width, which is making contact with adjacent patterns on both edges in a width direction of said micro pattern, and in the step of forming said correction micro pattern, the micro pattern is subjected to a processing of increasing the size in said width direction on both sides of the micro pattern.

14. The preparation method of an exposure original plate as claimed in claim 4, wherein said micro pattern is a rectangular pattern with a micro width which is making contact with an adjacent pattern on one edge in a width direction of said micro pattern, and in the step of forming said corrected micro pattern, the micro pattern is subjected to a processing of increasing the size in the width direction on one side of the micro pattern.

15. The preparation method of an exposure original plate as claimed in claim 4, wherein said micro pattern is a rectangular pattern with a micro width and a micro length which is making contact with adjacent patterns on edges on both sides in a width direction of said micro pattern, and in the step of forming said corrected micro pattern, the micro pattern is subjected to a processing of increasing the size of the micro pattern toward both edges in the width direction and toward both edges in a length direction of the micro pattern, respectively.

16. The preparation method of an exposure original plate as claimed in claim 4, wherein said step of extracting a micro pattern is on the basis of a minimum size at which EB exposure by the variable shaped exposure system which performs variable shaped beam exposure is possible in view of the optical proximity effect, and extracts a pattern with a size smaller than said minimum size as a micro pattern.

17. The preparation method of an exposure original plate as claimed in claim 4, wherein the pattern constituting said exposure original plate is a pattern to which an optical proximity correction is applied to a pattern based on design data.

18. The preparation method of an exposure original plate as claimed in claim 17, wherein said minimum size is 0.1 $\mu$m and the size of the side of said corrected micro pattern is increased to a size larger than 0.2 $\mu$m.

19. The preparation method of an exposure original plate as claimed in claim 17, wherein said optical proximity effect correction is at least an optical proximity effect correction by a bias method or an optical proximity effect correction by an inner serif method.

* * * * *